(12) United States Patent
Kinoshita et al.

(10) Patent No.: US 11,367,642 B2
(45) Date of Patent: Jun. 21, 2022

(54) SUBSTRATE PROCESSING APPARATUS AND PURGING METHOD

(71) Applicant: Tokyo Electron Limited, Tokyo (JP)

(72) Inventors: Moriyoshi Kinoshita, Iwate (JP); Yuji Sasaki, Iwate (JP); Junichi Sato, Iwate (JP); Takashi Asakawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 200 days.

(21) Appl. No.: 16/549,418

(22) Filed: Aug. 23, 2019

(65) Prior Publication Data

US 2020/0083078 A1 Mar. 12, 2020

(30) Foreign Application Priority Data

Sep. 6, 2018 (JP) .............................. JP2018-167219

(51) Int. Cl.
| | | |
|---|---|---|
| *H01L 21/673* | (2006.01) | |
| *H01L 21/67* | (2006.01) | |
| *F27D 3/00* | (2006.01) | |
| *H01L 21/677* | (2006.01) | |
| *F27D 7/06* | (2006.01) | |

(52) U.S. Cl.
CPC ...... *H01L 21/67389* (2013.01); *F27D 3/0084* (2013.01); *H01L 21/673* (2013.01); *H01L 21/67109* (2013.01); *H01L 21/67259* (2013.01); *H01L 21/67294* (2013.01); *H01L 21/67769* (2013.01); *H01L 21/67775* (2013.01); *F27D 2003/0085* (2013.01); *F27D 2007/063* (2013.01)

(58) Field of Classification Search
CPC ......... H01L 21/67389; H01L 21/67259; H01L 21/67775; H01L 21/67769; H01L 21/673; H01L 21/67109; H01L 21/67294; F27D 3/0084; F27D 2007/063; F27D 2003/0085
See application file for complete search history.

(56) References Cited

U.S. PATENT DOCUMENTS

| | | | | |
|---|---|---|---|---|
| 8,942,844 B2* | 1/2015 | Takahara | .......... | H01L 21/67393 700/214 |
| 9,082,694 B2* | 7/2015 | Saido | ................ | H01L 21/02381 |
| 9,230,845 B2* | 1/2016 | Otsuka | .............. | H01L 21/67769 |
| 9,245,781 B2* | 1/2016 | Takahara | .......... | H01L 21/67769 |
| 9,411,332 B2* | 8/2016 | Fosnight | ............ | G05B 19/4184 |
| 9,679,795 B2* | 6/2017 | Otsuka | .............. | H01L 21/67389 |
| 9,695,509 B2* | 7/2017 | Hirano | .............. | H01L 21/67769 |
| 9,911,635 B2* | 3/2018 | Hirano | ................... | C23C 16/54 |
| 9,960,065 B2* | 5/2018 | Kawasaki | ......... | H01L 21/67393 |

(Continued)

FOREIGN PATENT DOCUMENTS

| | | |
|---|---|---|
| JP | 2014-207306 A | 10/2014 |
| JP | 2015-29057 A | 2/2015 |

(Continued)

*Primary Examiner* — Nicolas A Arnett
(74) *Attorney, Agent, or Firm* — Abelman, Frayne & Schwab (57) ABSTRACT

A substrate processing apparatus includes: a carrier storage rack configured to place and store a carrier that accommodates a substrate; a gas supply configured to supply an inert gas into the carrier placed on the carrier storage rack; and a controller configured to control whether to supply the inert gas into the carrier based on at least one of carrier information and substrate information.

10 Claims, 9 Drawing Sheets

(56) References Cited

U.S. PATENT DOCUMENTS

| | | | |
|---|---|---|---|
| 9,997,387 B2* | 6/2018 | Murata | H01L 21/67373 |
| 10,096,501 B2* | 10/2018 | Inoshima | H01L 21/67745 |
| 10,332,766 B2* | 6/2019 | Sasaki | H01L 21/67757 |
| 10,361,109 B2* | 7/2019 | Omori | H01L 21/67393 |
| 10,410,894 B2* | 9/2019 | Onishi | B08B 9/08 |
| 10,796,937 B2* | 10/2020 | Yoon | H01L 21/67393 |
| 10,847,397 B2* | 11/2020 | Hayashi | H01L 21/67781 |
| 10,928,798 B2* | 2/2021 | Aizawa | C23C 16/4409 |
| 10,991,606 B2* | 4/2021 | Fujiwara | H01L 21/67766 |
| 2010/0210118 A1* | 8/2010 | Mizuno | H01L 21/0228 438/770 |
| 2010/0211216 A1* | 8/2010 | Morita | H01L 21/67288 700/228 |
| 2012/0052203 A1* | 3/2012 | Miyashita | H01L 21/67109 427/248.1 |
| 2016/0053377 A1* | 2/2016 | Taniyama | H01L 21/02164 438/758 |
| 2018/0229277 A1* | 8/2018 | Onishi | B08B 9/283 |

FOREIGN PATENT DOCUMENTS

| | | |
|---|---|---|
| JP | 2015-73062 A | 4/2015 |
| WO | 2017038237 A | 3/2017 |

\* cited by examiner

SUBSTRATE PROCESSING APPARATUS AND PURGING METHOD

CROSS-REFERENCE TO RELATED APPLICATIONS

This application is based on and claims priority from Japanese Patent Application No. 2018-167219 filed on Sep. 6, 2018 with the Japan Patent Office, the disclosure of which is incorporated herein in its entirety by reference.

TECHNICAL FIELD

The present disclosure relates to a substrate processing apparatus and a purging method.

BACKGROUND

A batch type substrate processing apparatus is provided with a carrier storage rack that temporarily stores carriers in order to process the wafers accommodated in a plurality of carriers at one time. An inert gas, for example, nitrogen gas is supplied into the carrier placed in the carrier storage rack. As a result, nitrogen substitution is performed in the carrier, and a cleanliness of the carrier is maintained (see, e.g., Japanese Patent Laid-Open Publication No. 2014-207306).

SUMMARY

A substrate processing apparatus according to an aspect of the present disclosure includes a carrier storage rack configured to place a carrier that accommodates a substrate; a gas supply configured to supply an inert gas into the carrier placed in the carrier storage rack; and a controller configured to control whether to supply the inert gas into the carrier based on at least one of carrier information and substrate information.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

(Substrate Processing Apparatus)

Figure 1:
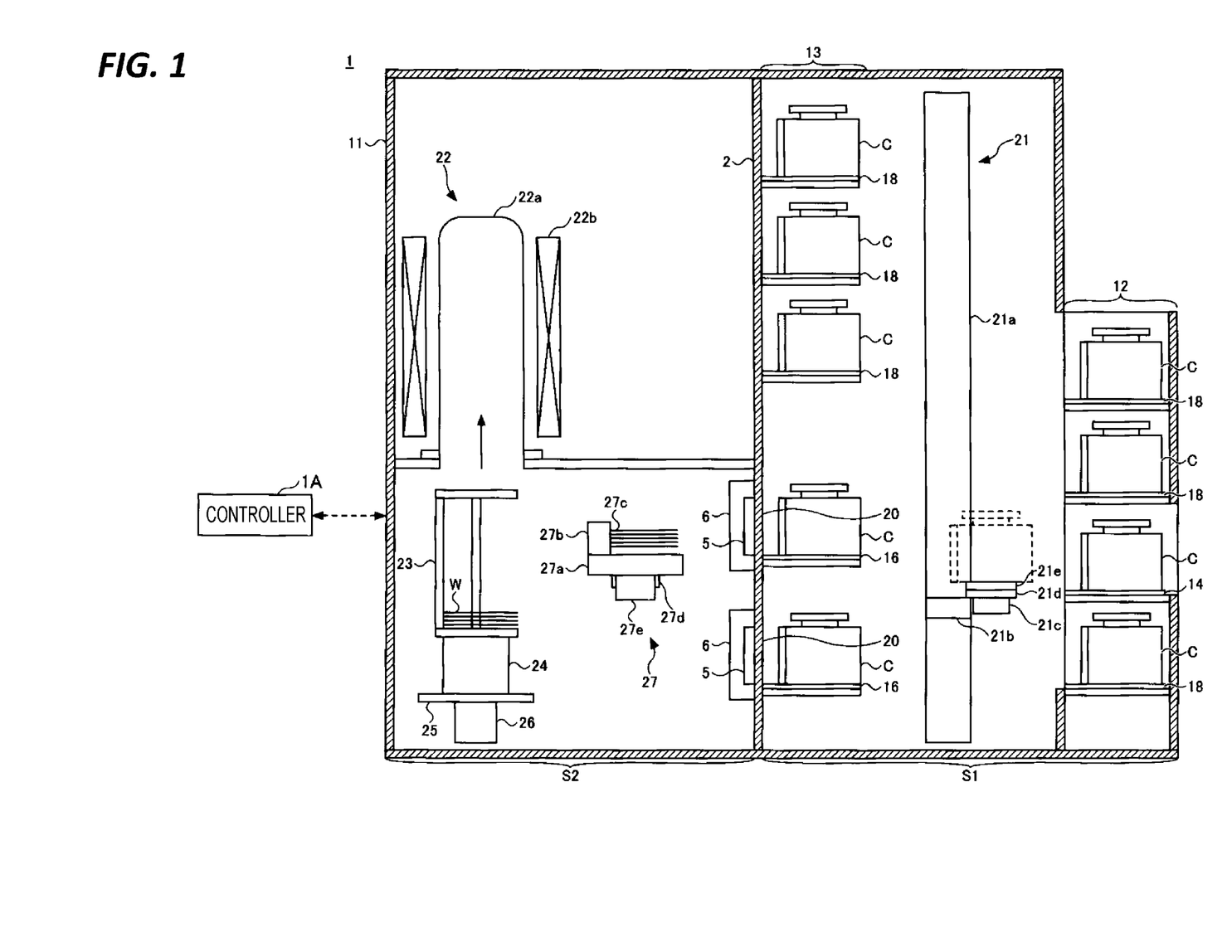
FIG. 1 is a cross-sectional view illustrating an exemplary configuration of a substrate processing apparatus.
Figure 2:
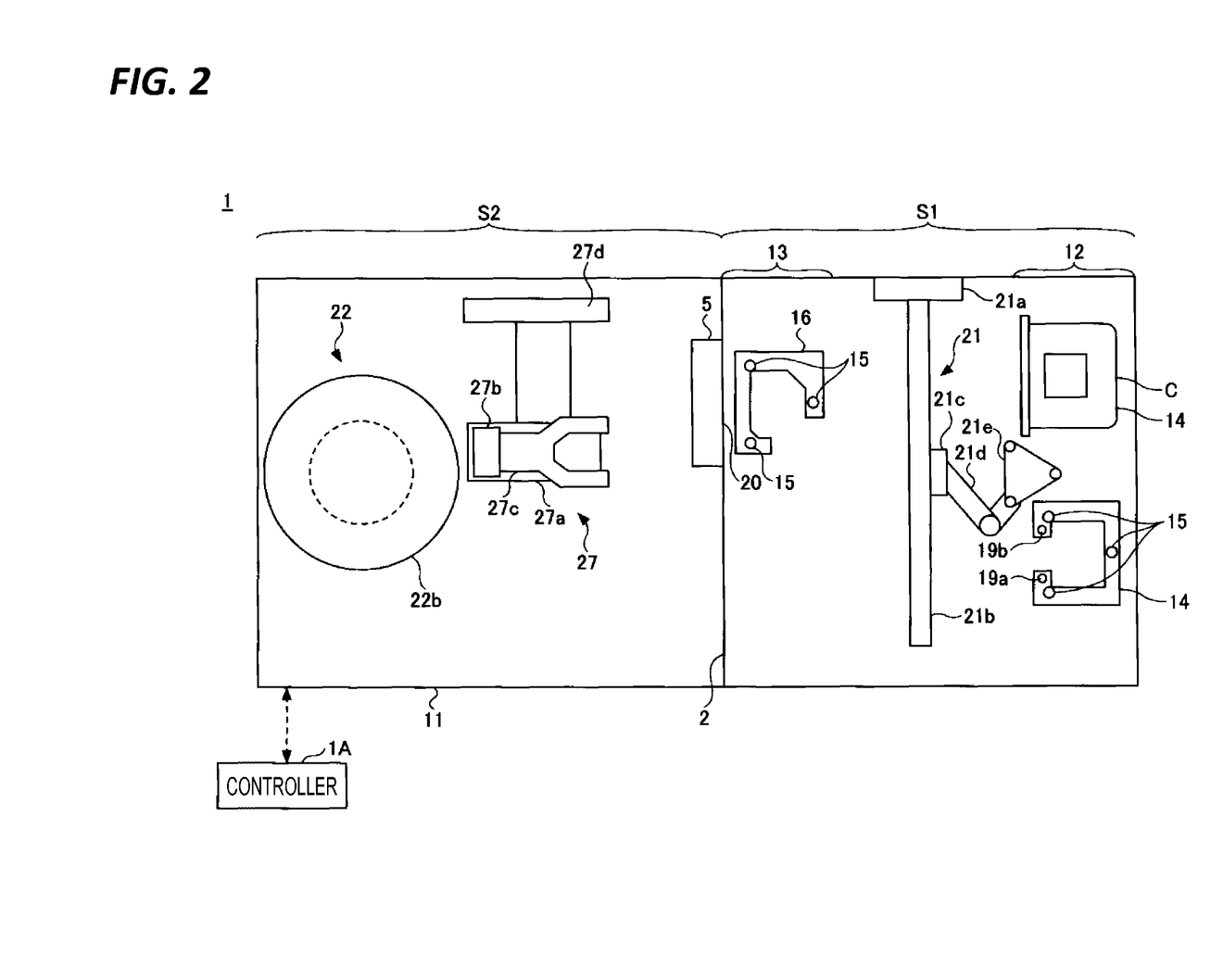
FIG. 2 is a plan view of the substrate processing apparatus of FIG. 1.

A substrate processing apparatus of an embodiment will be described. FIG. 1 is a cross-sectional view illustrating an exemplary configuration of a substrate processing apparatus. FIG. 2 is a plan view of the substrate processing apparatus of FIG. 1. In the embodiment, a vertical heat treatment apparatus having a vertical furnace will be described as an example of the substrate processing apparatus. However, the substrate processing apparatus may be an apparatus different from the vertical heat treatment apparatus.

As illustrated in FIGS. 1 and 2, a vertical heat treatment apparatus 1 is configured to be accommodated in a case 11. The case 11 constitutes an outer body of the vertical heat treatment apparatus 1. In the case 11, a carrier conveyance area S1 where a carrier C, which is a container that accommodates a wafer W, is carried into/carried out from the apparatus, and a wafer conveyance area S2 serving as a transfer area where the wafer W in the carrier C is conveyed and carried into a heat treatment furnace 22 (to be described later) are formed. The carrier C may be, for example, a front-opening unified pod (FOUP).

The carrier conveyance area S1 and the wafer conveyance area S2 are partitioned by a partition wall 2. The carrier conveyance area S1 is an area under the atmosphere, and is an area where the wafer W accommodated in the carrier C is conveyed. A region between processing apparatuses corresponds to the carrier conveyance area S1. In the embodiment, a space in an external clean room of the vertical heat treatment apparatus 1 corresponds to the carrier conveyance area S1. Meanwhile, the wafer conveyance area S2 is set to an inert gas atmosphere, for example, a nitrogen ($N_2$) gas atmosphere to prevent the formation of a natural oxide film on the carried-in wafer W, is cleaner than the carrier conveyance area S1, and is also maintained at a low oxygen concentration. In the following description, the arrangement direction of the carrier conveyance area S1 and the wafer conveyance area S2 is taken as the front-rear direction of the vertical heat treatment apparatus 1.

A conveyance port 20 is provided on the partition wall 2 to convey the wafer W between the carrier conveyance area S1 and the wafer conveyance area S2. The conveyance port 20 is opened/closed by an opening/closing door 5. The opening/closing door 5 is provided with a cover opening/closing mechanism 6 that opens/closes a cover of the carrier C. The conveyance port 20, the opening/closing door 5, and the cover opening/closing mechanism 6 are configured according to a front-opening interface mechanical standard (FIMS).

The carrier conveyance area S1 includes a first conveyance area 12 and a second conveyance area 13, which is positioned behind the first conveyance area 12 (wafer conveyance area S2 side).

As illustrated in FIG. 2, the first conveyance area 12 is provided with two load ports 14 placed to be arranged in the left-right direction. A load port 14 is a carry-in stage that receives the carrier C when the carrier C is carried in the vertical heat treatment apparatus 1. The load port 14 is provided at an opened portion of the wall of the case 11 and configured to enable access to the vertical heat treatment apparatus 1 from the outside. Specifically, carry-in and placement of the carrier C on the load port 14 and carry-out of the carrier C from the load port 14 to the outside may be performed by a carrier conveyance apparatus (not illustrated) provided outside the vertical heat treatment apparatus 1. In addition, the load port 14 is provided vertically in two tiers, and thus, the carry-in/carry-out of the carrier C in both directions may be performed.

In addition, carrier storage racks 18 are provided above and below the load port 14 arranged in the first conveyance area 12. A carrier storage rack 18 is a storage stage that temporarily stores the carrier C. The carrier storage rack 18 is also provided in the second conveyance area 13, but may be provided at a position in the first conveyance area 12 where the load port 14 is not present, in order to store a large number of carriers C in the vertical heat treatment apparatus 1.

In addition, the load port 14 on which the carrier C is placed may be provided in a plurality of tiers in the vertical direction of the first conveyance area 12. When the load port 14 is provided in a plurality of tiers in the vertical direction, each load port 14 may be provided in the left-right direction in plural. In addition, pins 15 are provided at, for example, three portions on a placement surface of each load port 14 to position the carrier C.

Each load port 14 may be provided with a supply nozzle 19a and an exhaust nozzle 19b. The bottom surface of the carrier C is provided with, for example, an intake port and an exhaust port. Therefore, in the load port 14, when the carrier C is placed, the supply nozzle 19a may be provided at a position where the intake port of the carrier C is fitted into, and the exhaust nozzle 19b may be provided at a position where the exhaust port of the carrier C is fitted into. By providing the supply nozzle 19a and the exhaust nozzle 19b, when the carrier C is placed on the load port 14, the inert gas substitution in the carrier C may be performed by supplying an inert gas such as $N_2$ gas into the carrier C. As a result, the carrier C, which is conveyed in a state where no inert gas is supplied while the inside space thereof is filled with the inert gas, may be immediately supplied with the inert gas again at the step of carrying into the load port 14 in the vertical heat treatment apparatus 1. Therefore, it is possible to consecutively keep the inside of the carrier C in a clean state.

The inert gas substitution in the carrier C on the load port 14 may be performed when the carrier C that accommodates the wafer W for which the processing has been completed is carried out from the vertical heat treatment apparatus 1, and the inert gas substitution in the carrier C placed on the load port 14 at the time of the carrying-out may also be performed.

In addition, the flow rate of the inert gas supplied to the carrier C at the time of the inert gas substitution on the load port 14 is required to be 1 (l/min) or more, taking $N_2$ gas as an example. Specifically, for example, the flow rate may be in a range of, for example, 10 l/min to 20 l/min, preferably 13 l/min to 17 l/min, and more preferably 15 l/min.

In a lower portion of the second conveyance area 13, two carrier stages 16 (see FIG. 1) are placed to be arranged in the vertical direction. Each carrier stage 16 is configured to be movable in the front-rear direction. Similarly to the load port 14, the pin 15 which positions the carrier C is also provided at three portions on a placement surface of the carrier stage 16. In the embodiment, although two carrier stages 16 are provided to be arranged in the vertical direction, a plurality of carrier stages 16 may be provided to be arranged in the horizontal direction.

As illustrated in FIG. 1, the carrier storage racks 18 are provided in the upper side of the second conveyance area 13 to store the carrier C. The carrier storage rack 18 is constituted by two or more tires of racks, and two carriers C may be placed on the left and right of each rack. An example in which the rack has three tiers is illustrated in FIG. 1. The carrier storage rack 18 is also referred to as a "buffer" or a "stocker."

Similarly to the load port 14, a supply nozzle and an exhaust nozzle may be provided on the bottom surface of the carrier storage rack 18, so that the inert gas substitution in the carrier C placed on the carrier storage rack 18 may be performed. In the inert gas substitution on the carrier storage rack 18, the flow rate of the inert gas supplied to the carrier C may also be the same as that of the load port 14, and is required to be 1 (l/min) or more, taking $N_2$ gas as an example. Specifically, for example, the flow rate may be in a range of, for example, 10 l/min to 20 l/min, preferably 13 l/min to 17 l/min, and more preferably 15 l/min Details of the configuration and functions of the carrier storage rack 18 including the supply nozzle and the exhaust nozzle will be described later.

As described above, it is desirable to perform the inert gas substitution in the load port 14 and the carrier storage rack 18. Since the carrier C such as a FOUP is not completely sealed, it is desirable to continuously perform the inert gas substitution, in order to maintain the humidity even after the inert gas substitution in the closed space using the cover opening/closing mechanism 6. Therefore, it is desirable to consecutively perform the inert gas substitution in the load port 14 and the carrier storage rack 18 as well. In order to continuously maintain the humidity in the carrier C after the inert gas substitution using the cover opening/closing mechanism 6, the flow rate of the inert gas is required to be 1 l/min or more.

A carrier conveyance mechanism 21 is provided in the second conveyance area 13 to convey the carrier C between the the load port 14, the carrier stage 16, and the carrier storage rack 18. The carrier conveyance mechanism 21 includes a first guide 21a, a second guide 21b, a moving unit 21c, an arm unit 21d, and a hand 21e. The first guide 21a is configured to extend in the vertical direction. The second guide 21b is configured to be connected to the first guide 21a, and to extend in the left-right direction. The moving unit 21c is configured to move in the left-right direction while being guided by the second guide 21b. The arm unit 21d includes one joint and two arms, and is provided to the moving unit 21c. The hand 21e is provided at the tip of the arm unit 21d.

The conveyance port 20 for the wafer W is provided on the partition wall 2 to communicate the carrier conveyance area S1 and the wafer conveyance area S2. The conveyance port 20 is provided with the opening/closing door 5 that is configured to block the conveyance port 20 from the wafer conveyance area S2 side. A driving mechanism (not illustrated) is connected to the opening/closing door 5, and the opening/closing door 5 is configured to be movable in the front-rear direction and the vertical direction by the driving mechanism, so that the conveyance port 20 is opened/closed.

The vertical heat treatment furnace 22 is provided in the wafer conveyance area S2 and has an opened lower end as a furnace port. The heat treatment furnace 22 is able to accommodate the wafer W, and includes a cylindrical processing container 22a made of quartz for performing the heat treatment of the wafer W. A cylindrical heater 22b is arranged around the processing container 22a, and the heat treatment of the accommodated wafer W is performed by heating of the heater 22b. A wafer boat 23 which holds a plurality of wafers W in a rack form is provided on a cap 25 through a heat insulating portion 24 below the heat treatment furnace 22. The cap 25 is supported on a lifting mechanism 26, and the wafer boat 23 is carried into or out from the heat treatment furnace 22 by the lifting mechanism 26.

A wafer conveyance mechanism 27 is provided between the wafer boat 23 and the conveyance port 20 of the partition wall 2. The wafer conveyance mechanism 27 includes a guide mechanism 27a, a moving body 27b, a fork 27c, a lifting mechanism 27d, and a rotating mechanism 27e. The guide mechanism 27a has a rectangular parallelepiped shape. The guide mechanism 27a is configured to be attached to the lifting mechanism 27d that extends in the vertical direction to be movable in the vertical direction by the lifting mechanism 27d, and to be rotatable by the rotating mechanism 27e. The moving body 27b is provided to be movable back and forth along the longitudinal direction on the guide mechanism 27a. The fork 27c is a transfer machine attached via the moving body 27b, and a plurality of (e.g., five) forks 27c are provided. Since a plurality of wafers W may be transferred at the same time by having a plurality of forks 27c, it is possible to shorten the time required to convey the wafers W. However, one fork 27c may be provided.

In addition, the vertical heat treatment apparatus 1 is provided with a controller 1A constituted by, for example, a computer. The controller 1A includes, for example, a data processing unit that is constituted by a program, a memory, and a CPU. In the program, an instruction (each step) is programed to send a control signal from the controller 1A to each unit of the vertical heat treatment apparatus 1 so as to proceed each processing step described in advance. Operations such as the conveyance of the carrier C, the conveyance of the wafer W, the opening/closing of the cover, the opening/closing of the opening/closing door 5, and the supply of the inert gas into the carrier C are controlled by the control signal so as to perform the conveyance and treatment of the wafer W. The program is stored in a computer storage medium, for example, a storage medium such as a flexible disk, a compact disk, a hard disk, a magneto-optical (MO) disk, or a memory card, and installed to the controller 1A.

Next, an example of a mechanism which performs the inert gas substitution in the carrier C placed on the carrier storage rack 18 will be described with reference to FIGS. 3 to 5.

Figure 3:
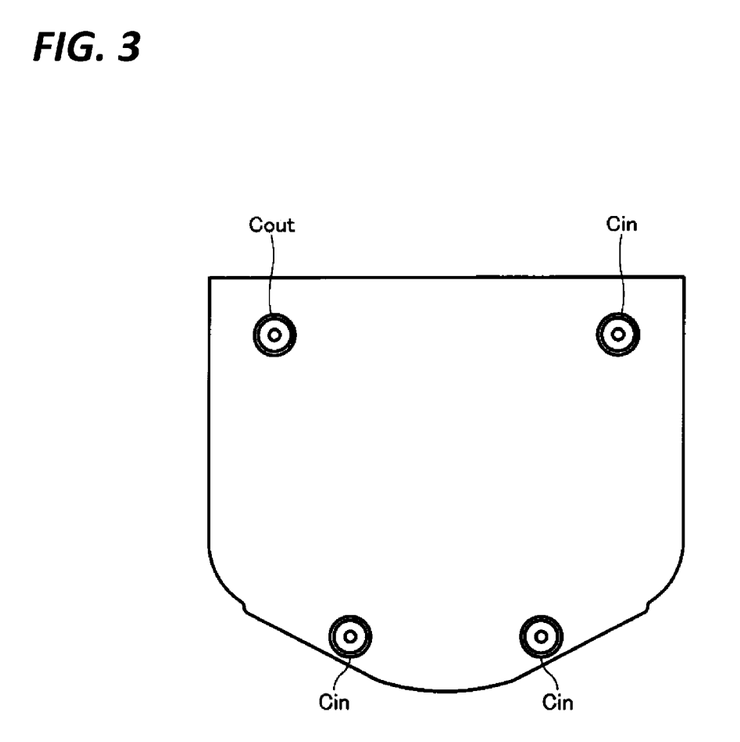
FIG. 3 is a view illustrating a bottom surface of an example of a carrier.

FIG. 3 is a view illustrating a configuration of a bottom surface of an example of the carrier C. The carrier C is used in various configurations depending on the usage, but for example, as illustrated in FIG. 3, includes an intake port Cin and an exhaust port Cout. The inert gas substitution in the carrier C may be performed by supplying nitrogen gas from the intake port Cin and exhausting through the exhaust port Cout.

In FIG. 3, there are three intake ports Cin and one exhaust port Cout, but it is not necessary to use the all intake ports Cin, and the intake port Cin suitable for the usage may be used as needed.

Figure 4A:
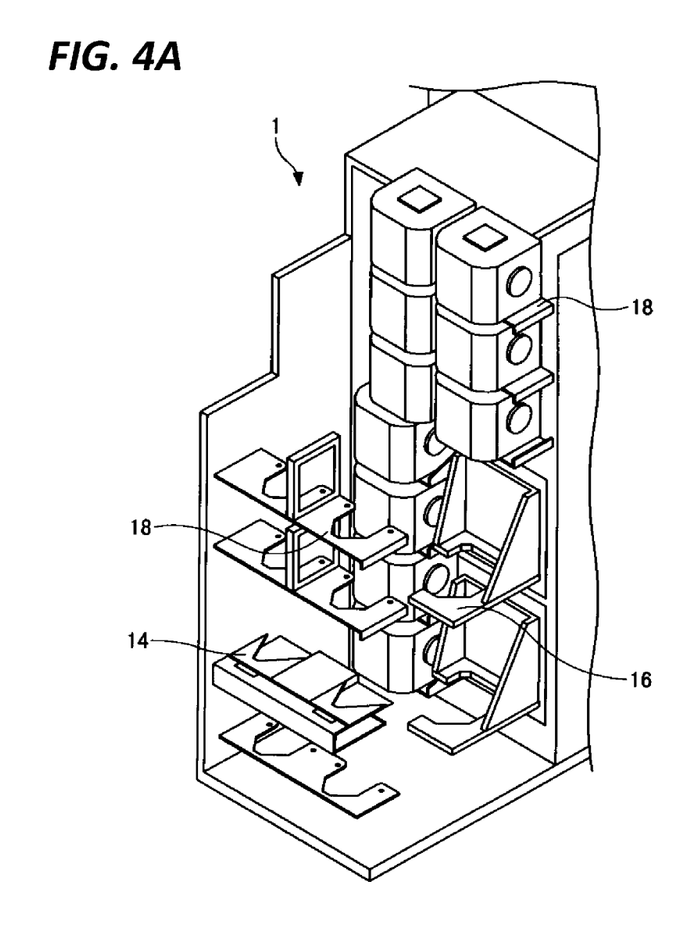
FIGS. 4A to 4D are views illustrating an example of a purge gas introduction unit of the carrier storage rack.

FIGS. 4A to 4D are views illustrating an example of a purge gas introduction unit of the carrier storage rack 18. FIG. 4A is a view illustrating a configuration of the carrier storage rack 18 of the vertical heat treatment apparatus 1 of the embodiment. As illustrated in FIG. 4A, a plurality of holes are formed on the surface of the placement surface of the carrier storage rack 18, so that a gas may be supplied to the carrier C. In addition, a plurality of holes may be also formed on the surface of the placement surface of the carrier stage 16, so that a gas may be supplied to the carrier C.

Figure 4B:
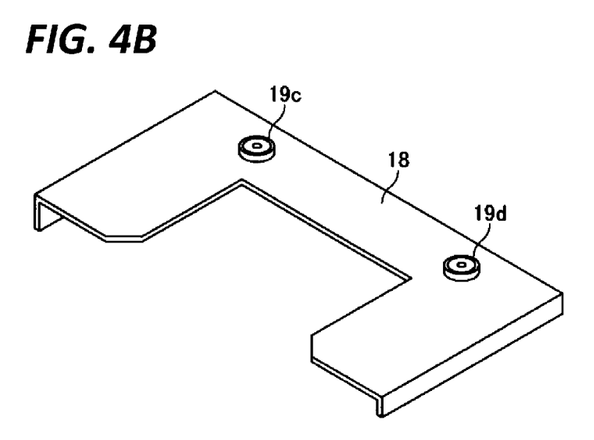

FIG. 4B is an enlarged view of a surface of an example of the carrier storage rack 18. As illustrated in FIG. 4B, a supply nozzle 19c and an exhaust nozzle 19d are formed on the surface of the carrier storage rack 18. The supply nozzle 19c is fitted into the intake port Cin of the carrier C to supply nitrogen gas into the carrier C through the intake port Cin of the carrier C. The exhaust nozzle 19d is fitted into the exhaust port Cout of the carrier C to exhaust the inside of the carrier C through the exhaust port Cout of the carrier C. Therefore, when the carrier C is placed on the carrier storage rack 18, the supply nozzle 19c and the exhaust nozzle 19d are formed at the position where they are fitted into the intake port Cin and the exhaust port Cout of the carrier C, respectively.

Figure 4C:
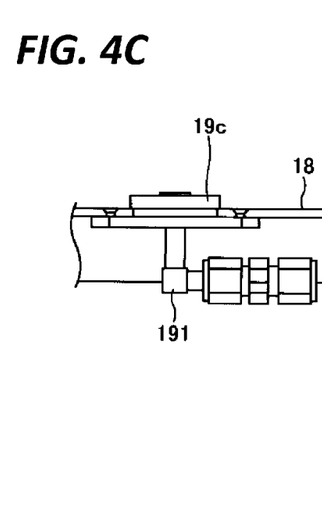

FIG. 4C is a view illustrating the supply nozzle 19c of the carrier storage rack 18. The supply nozzle 19c formed on the surface of the carrier storage rack 18 is connected to a supply pipe 191 on the rear surface, so that a gas may be supplied. The supply nozzle 19c and the supply pipe 191 function as a gas supply.

Figure 4D:
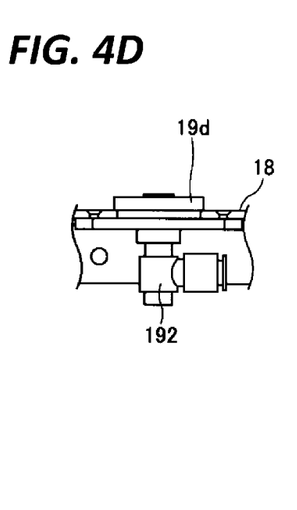

FIG. 4D is a view illustrating the exhaust nozzle 19d of the carrier storage rack 18. The exhaust nozzle 19d formed on the surface of the carrier storage rack 18 is connected to an exhaust pipe 192 on the rear surface, so that a gas may be exhausted. The exhaust nozzle 19d and the exhaust pipe 192 function as a gas exhaust unit.

The carrier storage rack 18 may perform the inert gas substitution while being stored using the intake port Cin and the exhaust port Cout of the carrier C by having such supply nozzle 19c and exhaust nozzle 19d.

Similarly to the supply nozzle 19c and the exhaust nozzle 19d of the carrier storage rack 18, the supply nozzle 19a and the exhaust nozzle 19b of the load port 14 illustrated in FIG. 2 may be configured to be connected to the supply pipe 191 and the exhaust pipe 192.

Figure 5:
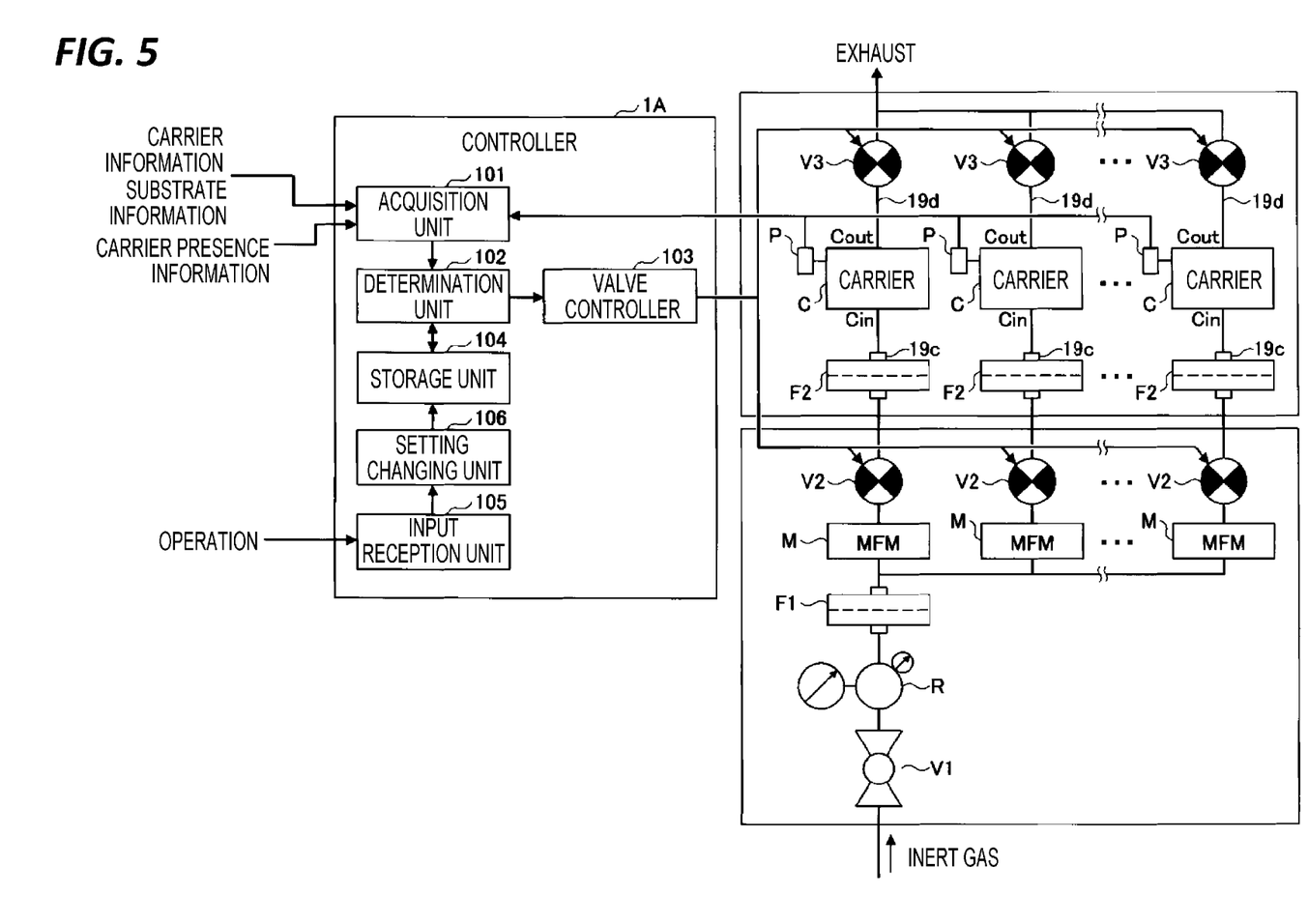
FIG. 5 is a view illustrating an example of a purge system.

FIG. 5 is a view illustrating an example of a purge system. As illustrated in FIG. 5, the purge system includes an opening/closing valve V1, a regulator R, a filter F1, a flow rate controller M, an opening/closing valve V2, a filter F2, the supply nozzle 19c, the exhaust nozzle 19d, an opening/closing valve V3, and a differential pressure gauge P provided in this order from the upstream side of the flow of the inert gas. In addition, the purge system includes the controller 1A that controls the operation of the respective units.

The opening/closing valves V1, V2, and V3 are valves which open/close the flow path of the inert gas. The opening/closing valves V2 and V3 are provided corresponding to the respective carriers C, and control the supply and cut off of the inert gas to the respective carriers C. The regulator R regulates the supplied high-pressure inert gas to a pressure according to the usage. The filters F1 and F2 are gas filters which remove impurities such as solid matter, oil, and water contained in the inert gas. The flow rate controller M is provided corresponding to the respective carriers C, and controls the flow rate of the inert gas supplied to the respective carriers C. The differential pressure gauge P measures the pressure difference between the inside and the outside of the carrier C.

In addition, in the supply system of such nitrogen gas, for example, in the exhaust nozzle 19d of the carrier storage rack 18, a sensor capable of measuring the humidity in the carrier C may be provided to manage the atmosphere in the carrier C by the humidity. Further, a sensor capable of measuring the humidity may be provided in the exhaust nozzle 19b of the load port 14. In addition, it is possible to estimate the humidity in the carrier C from some converted value instead of measuring the humidity directly, in order to manage the atmosphere in the carrier C by the humidity.

The controller 1A controls whether to supply the inert gas into the carrier C by controlling the opening/closing operation of the opening/closing valves V2 and V3, based on at least one of the carrier information and the substrate information. The controller 1A includes an acquisition unit 101, a determination unit 102, a valve controller 103, a storage unit 104, an input reception unit 105, and a setting changing unit 106.

The acquisition unit 101 acquires various information of the purge system. As an example of the various information, carrier information and substrate information of the carrier C placed on the carrier storage rack 18, a detected value of a presence sensor (not illustrated) attached to the carrier stage 16 or the carrier storage rack 18, and a detected value of the differential pressure gauge P may be included.

As the carrier information, for example, a carrier type and a carrier manufacturer may be included. The carrier type includes, for example, a product substrate, a dummy substrate, and a monitor substrate. The product substrate, the dummy substrate, and the monitor substrate are information indicating that the carrier respectively accommodates the product substrate, the dummy substrate, and the monitor substrate. As for the carrier types, types other than these may be included. The carrier manufacturer is information indicating the manufacturer that manufactures carriers, for example, company A, company B, and company C.

As the substrate information, for example, the presence or absence of a substrate, the number of substrates, and the usage state of a substrate may be included. The presence or absence of the substrate is information indicating whether the substrate is accommodated in the carrier. The number of substrates is information indicating the number of substrates accommodated in the carrier. The usage state of the substrate is information indicating the processing state of the substrate accommodated in the carrier, and includes, for example, an unprocessed state and a processed state.

The determination unit 102 determines whether the carrier C is placed on the carrier stage 16, based on, for example, the detected value of the presence sensor attached to the carrier stage 16 acquired by the acquisition unit 101. In addition, the determination unit 102 determines whether the carrier C is placed on the carrier storage rack 18, based on, for example, the detected value of the presence sensor attached to the carrier storage rack 18 acquired by the acquisition unit 101.

In addition, the determination unit 102 determines whether the carrier C placed on the carrier storage rack 18 is the purge target, based on at least one of the carrier information and the substrate information acquired by the acquisition unit 101. In the embodiment, the determination unit 102 determines whether the carrier information acquired by the acquisition unit 101 is the purge target, based on the carrier information acquired by the acquisition unit 101, carrier relationship information stored in the storage unit 104 and indicating the relationship between the carrier information and the presence or absence of the purge. For example, as the carrier relationship information stored in the storage unit 104, the presence or absence of the purge in the case where the carrier information is "the product substrate," "the dummy substrate," and "the monitor substrate" is set "with purge," "without purge," and "without purge," respectively. In this case, the determination unit 102 determines that the carrier C is the purge target when the carrier information acquired by the acquisition unit 101 is "the product substrate." Meanwhile, the determination unit 102 determines that the carrier C is not the purge target when the carrier information acquired by the acquisition unit 101 is "the dummy substrate," or "the monitor substrate."

In addition, the determination unit 102 determines whether the carrier information acquired by the acquisition unit 101 is the purge target, based on the substrate information acquired by the acquisition unit 101, substrate relationship information stored in the storage unit 104 and indicating the relationship between the substrate information and the presence or absence of the purge. For example, as the substrate relationship information stored in the storage unit 104, the presence or absence of the purge when the substrate information is "with a substrate" and "without a substrate," is set "with purge" and "without purge," respectively. In this case, the determination unit 102 determines that the carrier C is the purge target when the substrate information acquired by the acquisition unit 101 is "with a substrate." Meanwhile, the determination unit 102 determines that the carrier C is not the purge target when the substrate information acquired by the acquisition unit 101 is "without a substrate."

The determination by the determination unit 102 may be performed based on any one of the carrier information and the substrate information acquired by the acquisition unit 101, or may be performed based on both. When the determination is performed based on both the carrier information and the substrate information, the determination unit 102 may determine that the carrier C is the purge target in the case where both the carrier information and the substrate information are "with purge," and may determine that the carrier C is the purge target in the case where any one of the information is "with purge."

In addition, the determination unit 102 may determine whether the pressure difference between the inside and the outside of the carrier C measured by the differential pressure gauge P is equal to or less than a predetermined threshold value.

The valve controller 103 controls the supply and cut off of the inert gas into the carrier C by controlling the opening/closing operations of the opening/closing valves V2 and V3, based on the determination result of the determination unit 102. For example, when the determination unit 102 determines that the carrier C placed on the carrier storage rack 18 is the purge target, the valve controller 103 opens the opening/closing valves V2 and V3 which respectively control the supply and the exhaust of the inert gas to the carrier storage rack 18. Meanwhile, when the determination unit 102 determines that the carrier C placed on the carrier storage rack 18 is not the purge target, the valve controller 103 closes the opening/closing valves V2 and V3 which respectively control the supply and the exhaust of the inert gas to the carrier storage rack 18.

In addition, the valve controller 103 may control the opening/closing operations of the opening/closing valves V2 and V3 such that the inert gas is intermittently supplied into the carrier C when the inert gas is supplied into the carrier C. The consumption of the inert gas may be reduced by intermittently supplying the inert gas into the carrier C.

In addition, the valve controller 103 may control the opening/closing valves V2 and V3 so as to supply the inert gas into the carrier C by considering that the inert gas in the carrier C is leaked to the outside of the carrier C, when the pressure difference measured by the differential pressure gauge P is equal to or less than a predetermined threshold value. As a result, since the inert gas is supplied into the carrier C only when the pressure difference is equal to or less than the predetermined threshold value, the consumption of the inert gas may be reduced.

In addition, when the carrier C is placed on the carrier stage 16, the valve controller 103 may control the time for supplying the inert gas into the carrier C based on whether the carrier C is a carrier to be purged. For example, when the carrier C is a carrier to be purged, the valve controller 103 controls an operation of an opening/closing valve (not illustrated) that controls the supply and cut off of the inert gas supplied into the carrier C such that the time for supplying the inert gas into the carrier C is shortened. At this time, since the inert gas substitution is already performed in the carrier C in the carrier storage rack 18, a sufficient purge effect is obtained even if the time for the inert gas substitution in the carrier C on the carrier stage 16 is shortened. In addition, the amount of the inert gas used may be reduced.

The storage unit 104 stores information including the carrier relationship information indicating the relationship between the carrier information and the presence or absence of the purge, and the substrate relationship information indicating the relationship between the substrate information and the presence or absence of the purge.

The input reception unit 105 receives an operation of changing settings of the carrier relationship information and the substrate relationship information by a user.

When the input reception unit 105 receives the operation of changing the settings, the setting changing unit 106 rewrites and changes the settings of the carrier relationship information and the substrate relationship information stored in the storage unit 104. For example, the input reception unit 105 receives the operation of switching the purge setting of "the monitor substrate" from "without purge" to "with purge," the setting changing unit 106 rewrites and changes the purge setting of "the monitor substrate" stored in the storage unit 104 to "with purge."

(Purge Processing)

Figure 6:
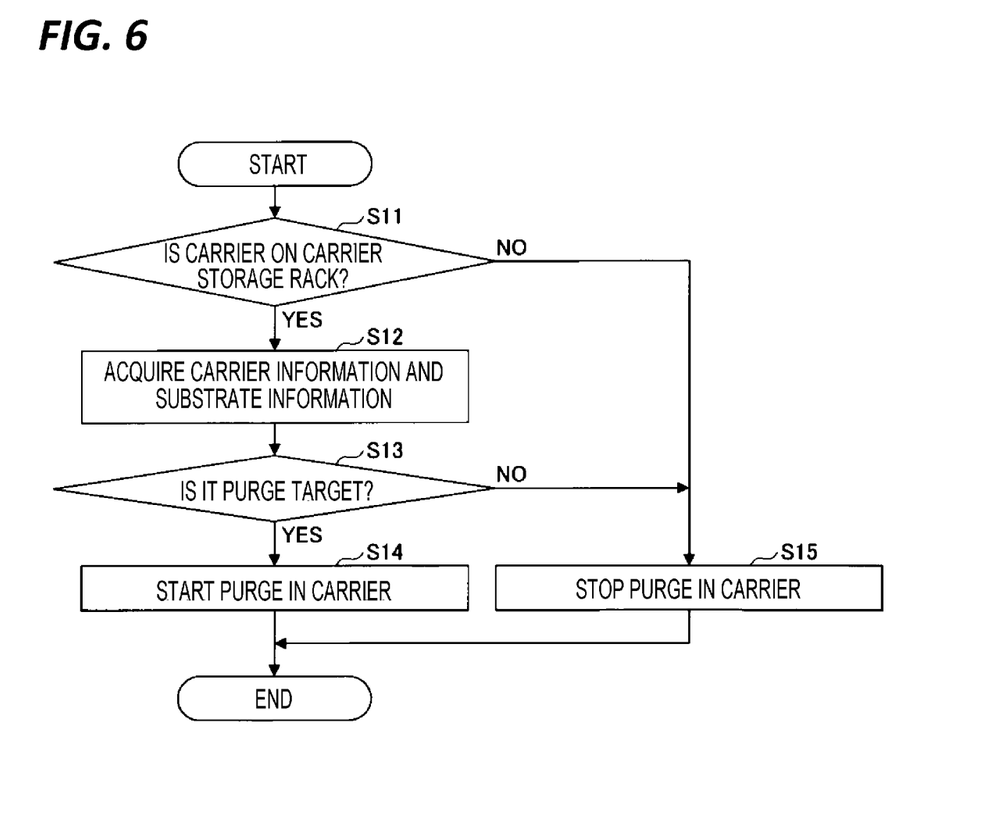
FIG. 6 is a flowchart illustrating an example of a purge processing in the carrier storage rack.

With reference to FIG. 6, an example of a purge processing (purge method) for the carrier C placed on the carrier storage rack 18 will be described. FIG. 6 is a flowchart illustrating an example of the purge processing in the carrier storage rack 18. The purge processing illustrated in FIG. 6 is repeatedly performed, for example, at predetermined time intervals by the controller 1A. In the following, as an example, the purge processing for one carrier storage rack 18 among the plurality of carrier storage racks 18 will be described, but the same applies to the purge processing for a separate carrier storage rack 18.

First, the determination unit 102 determines whether the carrier C is placed on the carrier storage rack 18 (step S11). Whether the carrier C is placed on the carrier storage rack 18 is determined based on, for example, the detected value of the presence sensor or the like attached to the carrier storage rack 18 acquired by the acquisition unit 101.

In step S11, when the determination unit 102 determines that the carrier C is placed on the carrier storage rack 18, the acquisition unit 101 acquires the carrier information and the substrate information of the carrier C (step S12). Meanwhile, in step S11, when the determination unit 102 determines that the carrier C is not placed on the carrier storage rack 18, the valve controller 103 closes the opening/closing valves V2 and V3 to cut off the supply of the inert gas into the carrier C (step S15). Then, after step S15, the processing is ended.

Subsequently, the determination unit 102 determines whether the carrier C placed on the carrier storage rack 18 is the purge target, based on at least one of the carrier information and the substrate information acquired by the acquisition unit 101 (step S13).

In step S13, when the determination unit 102 determines that the carrier C placed on the carrier storage rack 18 is the purge target, the valve controller 103 opens the opening/closing valves V2 and V3 to start the supply of the inert gas into the carrier C (step S14). At this time, the valve controller 103 may control the opening/closing operations of the opening/closing valves V2 and V3 such that the inert gas is intermittently supplied into the carrier C. The consumption of the inert gas may be reduced by intermittently supplying the inert gas into the carrier C. Then, after step S14, the processing is ended. Meanwhile, in step S13, when the determination unit 102 determines that the carrier C placed on the carrier storage rack 18 is not the purge target, the valve controller 103 closes the opening/closing valves V2 and V3 to cut off the supply of the inert gas into the carrier C (step S15). Then, after step S15, the processing is ended.

In the purge processing in FIG. 6, whether the carrier C placed on the carrier storage rack 18 is the purge target is determined based on at least one of the carrier information and the substrate information, and the inert gas is supplied into the carrier C only when the carrier C is the purge target. As a result, the amount of the inert gas used may be reduced as compared with the case where the inert gas is constantly supplied to the carrier C placed on the carrier storage rack 18.

Figure 7:
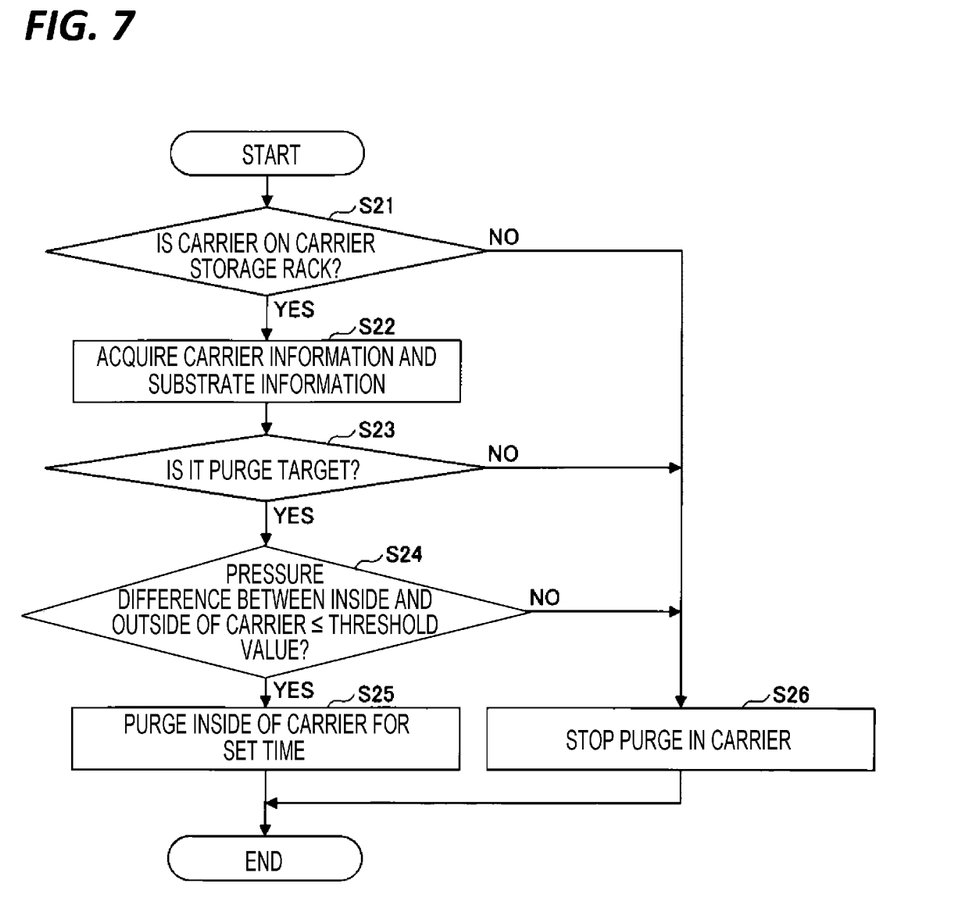
FIG. 7 is a flowchart illustrating another example of the purge processing in the carrier storage rack.

With reference to FIG. 7, a separate example of a purge processing for the carrier C placed on the carrier storage rack 18 will be described. FIG. 7 is a flowchart illustrating a separate example of the purge processing in the carrier storage rack 18. The purge processing illustrated in FIG. 7 is repeatedly performed, for example, at predetermined time intervals by the controller 1A. In the following, as an example, the purge processing for one carrier storage rack 18 among the plurality of carrier storage racks 18 will be described, but the same applies to the purge processing for a separate carrier storage rack 18.

First, steps S21 to S23 are executed. The processing of steps S21 to S23 may be the same as the processing of steps S11 to S13.

In step S23, when the determination unit 102 determines that the carrier C placed on the carrier storage rack 18 is the purge target, the determination unit 102 determines whether the pressure difference measured by the differential pressure gauge P is equal to or less than a predetermined threshold value (step S24).

In step S24, when the determination unit 102 determines that the pressure difference measured by the differential pressure gauge P is equal to or less than the predetermined threshold value, the valve controller 103 controls the opening/closing valves V2 and V3 so as to supply the inert gas into the carrier C for a predetermined time (step S25). Then, after step S25, the processing is ended. Meanwhile, in step S24, when the determination unit 102 determines that the pressure difference measured by the differential pressure gauge P is larger than the predetermined threshold value, the valve controller 103 closes the opening/closing valves V2 and V3 to cut off the supply of the inert gas into the carrier C (step S26). Then, after step S26, the processing is ended.

In the purge processing in FIG. 7, whether the carrier C placed on the carrier storage rack 18 is the purge target is determined based on at least one of the carrier information and the substrate information, and the inert gas is supplied into the carrier C only when the carrier C is the purge target. As a result, the amount of the inert gas used may be reduced as compared with the case where the inert gas is constantly supplied to the carrier C placed on the carrier storage rack 18.

In addition, in the purge processing in FIG. 7, when the pressure difference between the inside and the outside of the carrier C is equal to or less than the predetermined threshold value, the inert gas is supplied into the carrier C. As a result, the consumption of the inert gas may be reduced.

Figure 8:
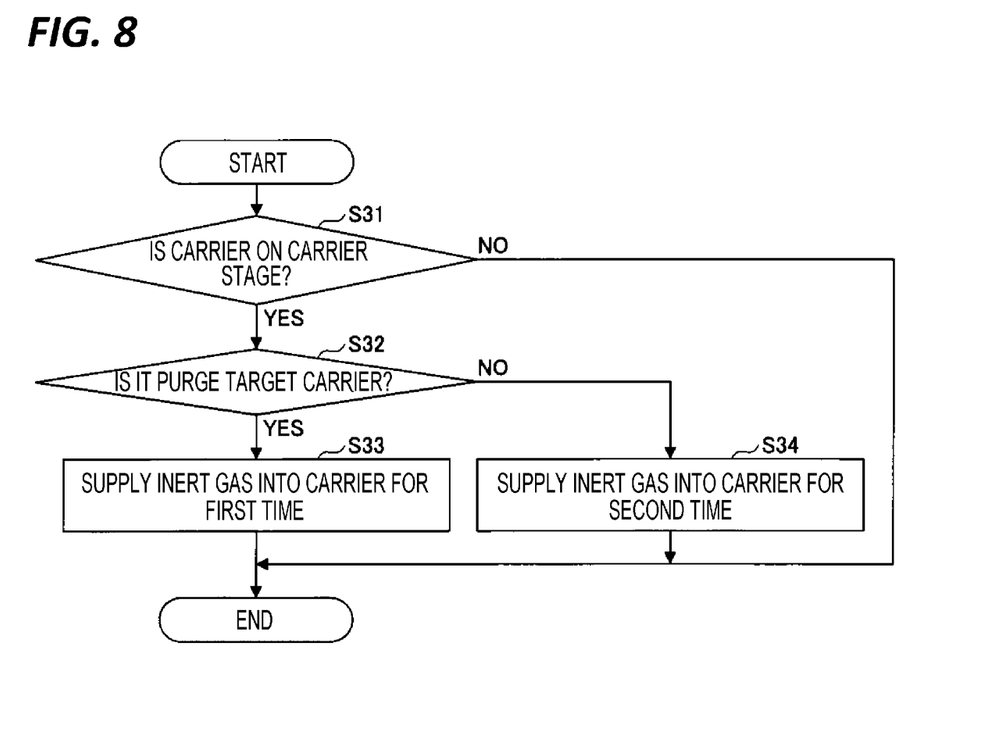
FIG. 8 is a flowchart illustrating an example of a purge processing in a carrier stage.

With reference to FIG. 8, an example of a purge processing for the carrier C placed on the carrier stage 16 will be described. FIG. 8 is a flowchart illustrating an example of the purge processing in the carrier stage 16. The purge processing illustrated in FIG. 8 is repeatedly performed, for example, at predetermined time intervals by the controller 1A. In the following, as an example, the purge processing for one carrier stage 16 among the plurality of carrier stages 16 will be described, but the same applies to the purge processing for a separate carrier stage 16.

First, the determination unit 102 determines whether the carrier C is placed on the carrier stage 16 (step S31). Whether the carrier C is placed on the carrier stage 16 is determined based on, for example, the detected value of the presence sensor or the like attached to the carrier stage 16 acquired by the acquisition unit 101.

In step S31, when the determination unit 102 determines that the carrier C is placed on the carrier stage 16, the determination unit 102 determines whether the carrier C placed on the carrier stage 16 is a carrier to be purged (step S32).

When it is determined that the carrier C placed on the carrier stage 16 is the carrier to be purged in step S32, the valve controller 103 controls the opening/closing operations of the opening/closing valves V2 and V3 such that the inert gas is supplied into the carrier C for a first time (step S33). Then, after step S33, the processing is ended. Meanwhile, when it is determined that the carrier C placed on the carrier stage 16 is not the purge target in step S32, the valve controller 103 controls the opening/closing operations of the opening/closing valves V2 and V3 such that the inert gas is supplied into the carrier C for a second time (step S34). Then, after step S34, the processing is ended. The first time is set to be shorter than the second time. It is because, since the inside of the carrier C has been purged in the carrier storage rack 18 when the carrier C placed on the carrier stage 16 is the carrier to be purged, the inside of the carrier C is sufficiently purged in a short time. As a result, the consumption of the inert gas supplied into the carrier C in the carrier stage 16 may be reduced.

(Operation of Substrate Processing Apparatus)

Figure 9:
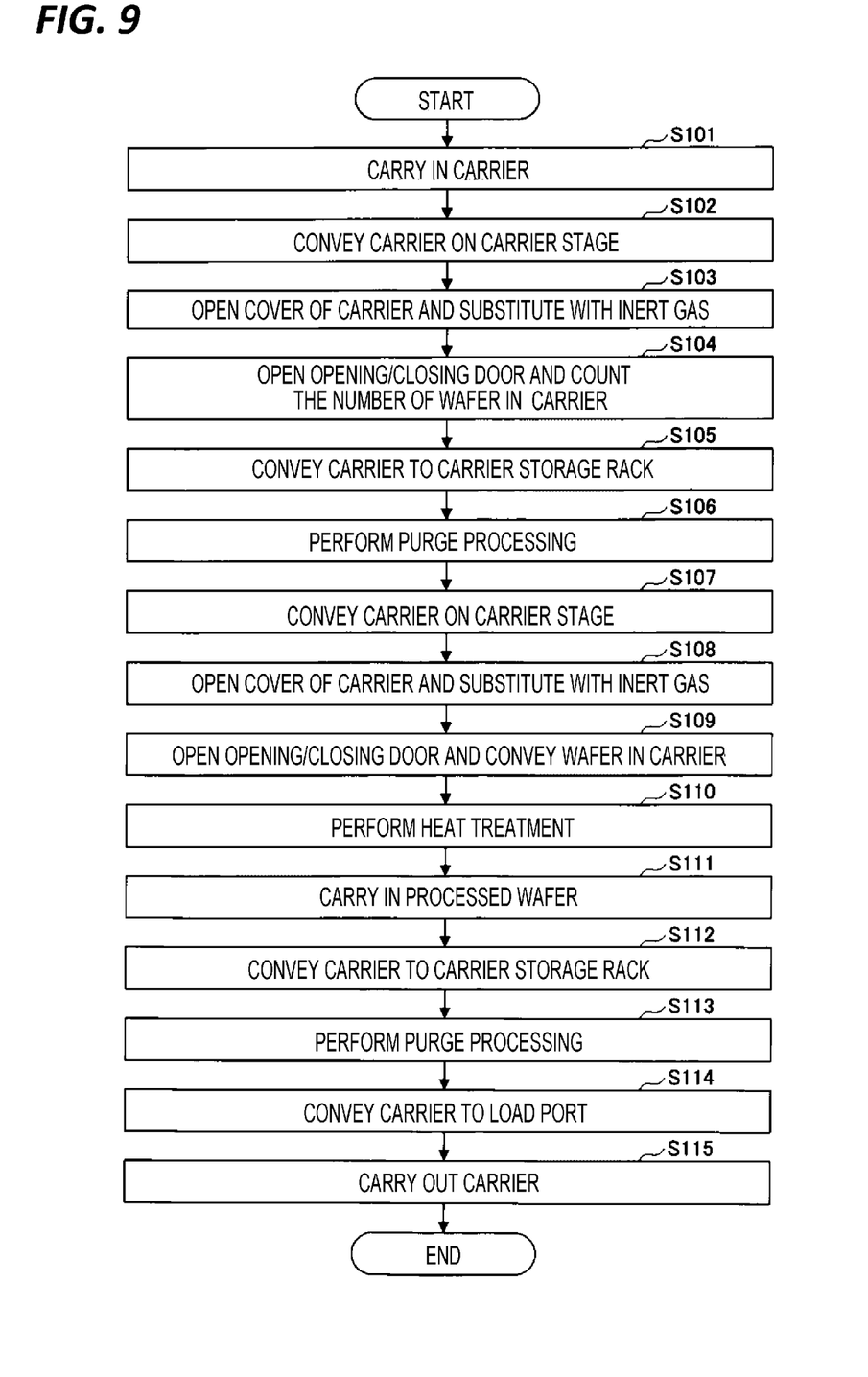
FIG. 9 is a flowchart for describing an example of an operation of the substrate processing apparatus.

An operation of a substrate processing apparatus of an embodiment will be described by taking the case where the heat treatment is performed on the wafer W by the above-described vertical heat treatment apparatus 1 as an example. FIG. 9 is a flowchart for describing an example of the operation of the substrate processing apparatus.

First, the carrier C is placed on the load port 14 by an automatic conveyance robot (not illustrated) moving along the ceiling of the clean room (step S101). However, instead of the automatic conveyance robot, the user may place the carrier C on the load port 14.

Subsequently, the carrier C is conveyed on the carrier stage 16 by the carrier conveyance mechanism 21, and the carrier stage 16 is moved toward the partition wall 2 (step S102). As a result, the opening edge of the carrier C is airtightly abuts on a seal member at the inlet edge around the conveyance port 20 of the partition wall 2.

Subsequently, the cover of the carrier C is removed by the cover opening/closing mechanism 6, and the inert gas (e.g., $N_2$ gas) is supplied into the carrier C from a gas supply port (not illustrated) to substitute the inside of the carrier C with the inert gas (step S103).

When the inert gas substitution in the carrier C is completed, the opening/closing door 5 is opened, and the number of wafers W in the carrier C is counted by a mapping sensor attached to the tip of the fork 27c of the wafer conveyance mechanism 27 (step S104). After counting the number of wafers W in the carrier C, the opening/closing door 5 is closed, and the cover is mounted on the carrier C by the cover opening/closing mechanism 6.

Subsequently, the carrier C is conveyed from the carrier stage 16 to the carrier storage rack 18 by the carrier conveyance mechanism 21 (step S105).

Subsequently, the purge processing described using FIG. 6 or FIG. 7 is performed on the carrier C placed on the carrier storage rack 18 (step S106). The purge processing is continuously performed while the carrier C is placed on the carrier storage rack 18.

Subsequently, the carrier C is conveyed from the carrier storage rack 18 to the carrier stage 16 by the carrier conveyance mechanism 21, and the carrier stage 16 is moved toward the partition wall 2 (step S107). As a result, the opening edge of the carrier C is airtightly abuts on a seal member at the inlet edge around the conveyance port 20 of the partition wall 2.

Subsequently, the cover of the carrier C is removed by the cover opening/closing mechanism 6, and the inert gas (e.g., $N_2$ gas) is supplied into the carrier C from a gas supply port (not illustrated) to substitute the inside of the carrier C with the inert gas (step S108). At this time, the purge processing described using FIG. 8 is performed. That is, the time for supplying the inert gas into the carrier C is controlled, based on whether the carrier C placed on the carrier stage 16 is the carrier to be purged.

Subsequently, the opening/closing door 5 is opened, and the wafer W in the carrier C is carried into the wafer conveyance area S2 by the wafer conveyance mechanism 27 (step S109).

Subsequently, the heat treatment is performed on the wafer carried into the wafer conveyance area S2 (step S110).

Subsequently, the processed wafer W is carried into the carrier C using the cover opening/closing mechanism 6 (step S111).

Subsequently, the carrier C which accommodates the processed wafer W is conveyed to the carrier storage rack 18 by the carrier conveyance mechanism 21 (step S112).

Subsequently, the purge processing described using FIG. 6 or FIG. 7 is performed on the carrier C placed on the carrier storage rack 18 (step S113).

Subsequently, the carrier C is conveyed from the carrier storage rack 18 to the load port 14 by the carrier conveyance mechanism 21 (step S114). The carrier C which accommodates the processed wafer W may be conveyed from the carrier stage 16 to the load port 14 without being conveyed to the carrier storage rack 18.

Subsequently, the carrier C which accommodates the processed wafer W is carried out from the vertical heat treatment apparatus 1, and is conveyed to the next processing apparatus (step S115).

As described above, according to the substrate processing apparatus of the embodiment, it is controlled whether the inert gas is supplied into the carrier C placed on the carrier storage rack 18, based on at least one of the carrier information and the substrate information. Therefore, the amount of the inert gas used may be reduced as compared with the case where the inert gas is constantly supplied into the carrier C placed on the carrier storage rack 18.

According to the present disclosure, the amount of the inert gas used may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a carrier storage rack configured to place and store a carrier that accommodates a substrate;
    a gas supply configured to supply an inert gas into the carrier placed on the carrier storage rack; and
    a controller configured to determine whether to supply the inert gas into the carrier placed on the carrier storage rack based on at least one of carrier information and substrate information, and intermittently supply the inert gas into the carrier by repeating stopping and resuming a supply of the inert gas when determined to supply the inert gas,
    wherein whether to supply the inert gas into the carrier is determined based on whether a pressure difference between an inside and an outside of the carrier is a predetermined threshold value or less.

2. The substrate processing apparatus according to claim 1, wherein the carrier information includes at least one of a carrier type and a carrier manufacturer.

3. The substrate processing apparatus according to claim 2, wherein the substrate information includes at least one of presence or absent of the substrate, number of substrates, and a usage state of the substrate in the carrier.

4. The substrate processing apparatus according to claim 3, further comprising:
    a differential pressure gauge configured to measure a pressure difference between an inside of the carrier and an outside of the carrier,
    wherein the controller controls the gas supply such that the inert gas is supplied into the carrier when the pressure difference measured by the differential pressure gauge is a predetermined threshold value or less.

5. The substrate processing apparatus according to claim 1, wherein the substrate information includes at least one of presence or absent of the substrate, number of substrates, and a usage state of the substrate in the carrier.

6. The substrate processing apparatus according to claim 1, further comprising:
    a differential pressure gauge configured to measure a pressure difference between an inside of the carrier and an outside of the carrier,
    wherein the controller is configured to control the gas supply such that the inert gas is supplied into the carrier, when the pressure difference measured by the differential pressure gauge is a predetermined threshold value or less.

7. A purging method comprising:
    placing a carrier accommodating a substrate on a carrier storage rack;
    determining whether to supply an inert gas into the carrier placed on the carrier storage rack based on at least one of carrier information and substrate information; and
    intermittently supplying the inert gas into the carrier placed on the carrier storage rack by repeating stopping and resuming of the supplying, when determined to supply the inert gas in the determining,
    wherein whether to supply the inert gas into the carrier is determined based on whether a pressure difference between an inside and an outside of the carrier is a predetermined threshold value or less.

8. A substrate processing apparatus comprising:
    a carrier conveyance area where a carrier accommodating a substrate is carried in/carried out;
    a wafer conveyance area where the substrate in the carrier carried into the carrier conveyance area is conveyed to be carried into a processing furnace; and
    a controller,
    wherein the carrier conveyance area includes:
    a carrier storage rack configured to place and store a carrier;
    a carrier stage on which the carrier is placed when the substrate in the carrier is conveyed to the wafer conveyance area; and
    a gas supply configured to supply an inert gas into the carrier placed on the carrier storage rack and the carrier stage; and
    the controller is configured to determine whether to supply the inert gas into the carrier placed on the carrier storage rack, based on at least one of carrier information and substrate information, and control a time for supplying the inert gas into the carrier placed on the carrier stage rack, based on whether the carrier placed on the carrier stage has been supplied with the inert gas on the carrier storage rack.

9. The substrate processing apparatus according to claim 8, wherein the controller is configured to:
    control the gas supply to supply the inert gas into the carrier placed on the carrier stage for a first time when the inert gas has been supplied into the carrier placed on the carrier storage rack; and
    control the gas supply to supply the inert gas into the carrier placed on the carrier stage for a second time when the inert gas has not been supplied into the carrier placed on the carrier storage rack.

10. The substrate processing apparatus according to claim 9, wherein the first time is shorter than the second time.

* * * * *